United States Patent
Park et al.

(10) Patent No.: US 9,768,381 B2
(45) Date of Patent: Sep. 19, 2017

(54) RESISTIVE RANDOM ACCESS MEMORY DEVICE HAVING A NANO-SCALE TIP, MEMORY ARRAY USING THE SAME AND FABRICATION METHOD THEREOF

(71) Applicants: Seoul National University R&DB FOUNDATION, Seoul (KR); Gachon University of Industry-Academic cooperation Foundation, Gyeonggi-do (KR)

(72) Inventors: Byung-Gook Park, Seoul (KR); Seongjae Cho, Seoul (KR); Sunghun Jung, Daegu (KR)

(73) Assignee: Seoul National University R&DB Foundation (KR)

( * ) Notice: Subject to any disclaimer, the term of this patent is extended or adjusted under 35 U.S.C. 154(b) by 0 days.

(21) Appl. No.: 14/797,576

(22) Filed: Jul. 13, 2015

(65) Prior Publication Data
US 2016/0104838 A1    Apr. 14, 2016

(30) Foreign Application Priority Data
Oct. 14, 2014    (KR) .......................... 10-2014-0138665

(51) Int. Cl.
*H01L 45/00*    (2006.01)
*H01L 27/24*    (2006.01)

(52) U.S. Cl.
CPC ...... *H01L 45/1273* (2013.01); *H01L 27/2472* (2013.01); *H01L 45/04* (2013.01); *H01L 45/1233* (2013.01); *H01L 45/16* (2013.01); *H01L 45/1675* (2013.01)

(58) Field of Classification Search
CPC . H01L 45/1273; H01L 45/1675; H01L 45/06; H01L 45/1253; H01L 45/145; H01L 45/16087; H01L 45/1233; H01L 45/146; H01L 45/1641; H01L 21/8229; H01L 21/8239; H01L 27/04; H01L 27/0802; H01L 27/1052; H01L 27/11551;
(Continued)

(56) References Cited

U.S. PATENT DOCUMENTS 5,687,112 A * 11/1997 Ovshinsky .............. G11C 11/56
257/3
2003/0062516 A1* 4/2003 Peterson ............. H01L 21/8221
257/4
(Continued)

FOREIGN PATENT DOCUMENTS

| KR | 10-2008-0048757 | 6/2008 |
|---|---|---|
| KR | 10-1113014 | 2/2012 |
| KR | 10-1263309 | 5/2013 |

*Primary Examiner* — Galina Yushina
(74) *Attorney, Agent, or Firm* — Gerald E. Hespos; Michael J. Porco; Matthew T. Hespos

(57) ABSTRACT

The present invention relates to a resistive random access memory device having a nano-scale tip, memory array using the same and fabrication method thereof. Especially, the present invention provides a technique forming a bottom electrode having an upwardly protruding tapered tip structure through etching a semiconductor substrate in order that an electric field is focused on the tip of the bottom electrode across a top electrode and that a region where conductive filaments are formed is maximally minimized or localized.

6 Claims, 10 Drawing Sheets

(58) Field of Classification Search
CPC ......... H01L 27/11578; H01L 27/11587; H01L 27/2409; H01L 27/2436
See application file for complete search history.

(56) References Cited

U.S. PATENT DOCUMENTS

| | | | |
|---|---|---|---|
| 2013/0001501 A1* | 1/2013 | Sills | H01L 45/04 257/4 |
| 2013/0112936 A1* | 5/2013 | Wei | H01L 45/08 257/4 |

* cited by examiner

FIG. 17
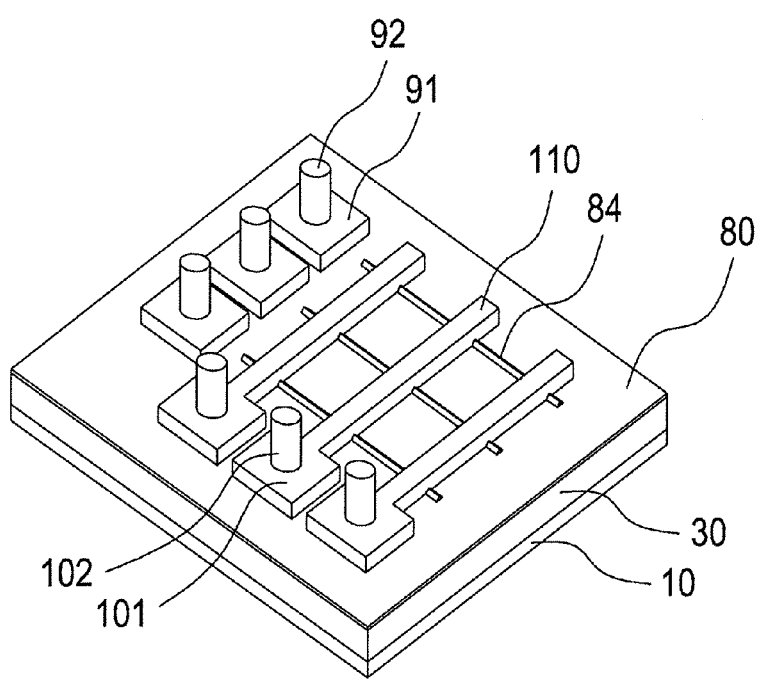
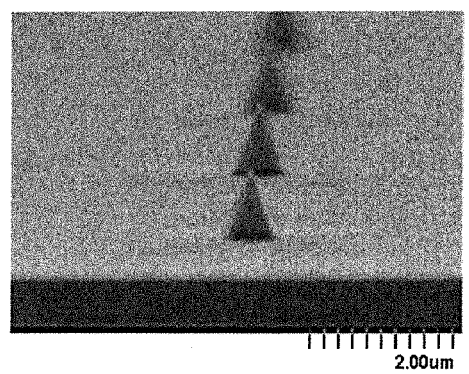
FIG. 18(a)
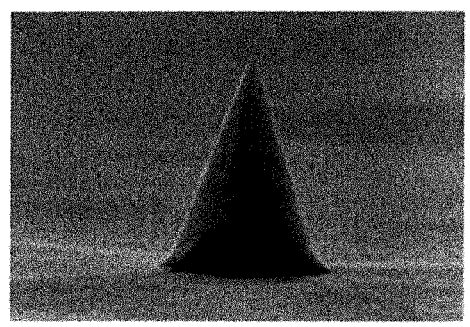
FIG. 18(b)

RESISTIVE RANDOM ACCESS MEMORY DEVICE HAVING A NANO-SCALE TIP, MEMORY ARRAY USING THE SAME AND FABRICATION METHOD THEREOF

CROSS-REFERENCE TO RELATED APPLICATION

This application claims priority to Korean Patent Application No. 10-2014-0138665, filed on Oct. 14, 2014, under 35 U.S.C. 119, the entire contents of which are hereby incorporated by reference.

BACKGROUND OF INVENTION

1. Field of the Invention

The present invention relates to a resistive memory device, and more particularly to a resistive random access memory device having a nano-scale tip, memory array using the same and fabrication method thereof.

2. Description of the Related Art

A resistive random access memory device, called RRAM, is a memory device using a resistance change layer configured to change its resistance according to an applied voltage such as a transition metal oxide.

This RRAM is expected to be a next generation memory that can exceed the NAND flash memory, which is the current mainstream memory technology in features of the operation speed, power consumption and integration density. Although RRAM reports have been made from 2005, over the last 10 years and now RRAM studies have not advanced from the research level of finding the material that allows the resistance change. Even though many materials applicable to RRAM were found already, people have not yet studied earnestly on the optimal design issue of the device.

The reasons are various. Among them, as shown in FIGS. 1 and 2 cited from Korean Patent No. 10-1113014, the conventional RRAM has a chronic reliability problem because of instability of Reset $v_{RESET}$ and Set $v_{SET}$ voltages. Here, $v_{SET}$ is an applied voltage when an electrical conduction path (i.e., filament) formed in a resistance change layer between the bottom and top electrodes is connected (namely, at the time of shifting into a low resistance state, LRS) and $v_{RESET}$ is an applied voltage when the filament is disconnected (namely, at the time of shifting into a high resistance state, HRS). Generally, Set voltage is higher than Reset voltage ($v_{SET} > v_{RESET}$) and a program margin is the voltage difference ($v_{SET} - v_{RESET}$) between Set and Reset voltages. And a data storage state can be read by sensing a current flowing between bottom and top electrodes after applying a read voltage lower than Reset voltage. A read margin is the current difference between LRS and HRS currents in the read voltage.

The reason of the reliability problem is that filaments are variously formed in a vertical direction due to the grain boundaries of materials (e.g., transition metal oxides) which form the resistance change layer.

To overcome the above problem, Korean Patent No. 10-1113014 discloses an attempt to minimize the number of filaments involved into the transition by forming the resistance change layer as a spacer shape to minimize maximally the area contacting the top electrode. Korean Patent Publication No. 10-2008-0048757 discloses an attempt to form reproducible filaments by focusing electric field through a protruding bottom or top electrode filled in a groove formed along a grain boundary of a resistance change layer. Korean Patent No. 10-1263309 discloses a technology for concentrating electric field by protruding a single top electrode toward a bottom electrode in each cell through processes for fabricating a side wall and a spacer.

However, Korean Patent No. 10-1113014 has a limit of technique for minimizing the number of filaments because the resistance change layer is formed as a spacer shape. Korean Patent Publication No. 10-2008-0048757 has difficulty in commercialization by being formed with not only a plurality of protruding parts but also a non-uniform shape because grooves are formed on the surface by the chemical etching process when the protruding part of the top electrode is formed or because the protruding part is formed of metal particles that remain after coating and evaporating the liquid mixture containing various metal particles when protruding part of the bottom electrode is formed. In Korean Patent No. 10-1263309, it discloses a fabrication method that cannot form the protruding part on the bottom electrode.

SUMMARY OF THE INVENTION

The present invention is contrived to overcome the mentioned problems by forming a bottom electrode having a very sharp peak typed protruding part of a scale of a few nanometers by an anisotropic etching on a semiconductor substrate. And the objective of the present invention is to provide resistive random access memory devices having a nano-scale tip, a memory array using the same and fabrication method thereof for allowing a high compatibility with the conventional semiconductor processes and a reproducible and massive production.

To achieve the objective, a resistive random access memory device according to the present invention comprises: a bottom electrode formed in a first direction by etching a semiconductor substrate, the bottom electrode having an upwardly protruding tapered tip structure; an interlayer insulating film formed on the bottom electrode, the interlayer insulating film wrapping around the tip structure except for an upper part of the tip structure; a resistance change layer formed on the upper part of the tip structure and the interlayer insulating film; and a top electrode formed on the resistance change layer in a second direction across the bottom electrode over the tip structure.

The tip structure may have a polygonal cone shape, a conical cone shape or a wedge shape, the wedge shape being configured to have a predetermined length in the first direction and a triangular cross-section in the second direction.

The resistance change layer may be upwardly protruded along the upper part of the tip structure and the top electrode may be formed to wrap the protruding part of the resistance change layer.

The tip structure may have an upper end size of 10 nm or less in the second direction.

A memory array according to the present invention comprises: a semiconductor substrate; a plurality of bit lines formed in a first direction on the semiconductor substrate; and a plurality of word lines formed in a second direction across the bit lines, a resistance change layer being located between the word lines and the bit lines, wherein the bit lines are formed in one body with the semiconductor substrate, each of the bit lines being a bottom electrode line doped with an impurity and electrically insulated from adjacent lines with an isolation insulating film, the bottom electrode line having upwardly protruding tapered tip structures along the first direction, wherein an interlayer insulating film is further formed between the bit lines and the resistance change layer, the interlayer insulating film wrapping around the tip structures except for upper parts of the tip structures, wherein the resistance change layer is formed on the upper parts of the tip structures of the each bit line, the interlayer insulating film and the isolation insulating film, and wherein each of the word lines is formed of a top electrode line passing over the tip structures of the bit lines along the second direction.

A method for fabricating a memory array according to the present invention comprises: a first step of protruding a plurality of semiconductor lines for forming a plurality of contacts and bit lines by etching a semiconductor substrate; a second step of forming an isolation insulating film by depositing a first insulating material on the semiconductor substrate and etching the first insulating material to expose upper parts of the semiconductor lines and to be insulated from each other; a third step of forming protruding patterns on the upper parts of the semiconductor lines; a fourth step of forming upwardly protruding tapered tip structures from the protruding patterns; a fifth step of forming a plurality of contacts and bit lines on the upper parts of the semiconductor lines by an ion implantation process; a sixth step of depositing a second insulating material on the upper parts of the plurality of contacts and bits lines and the isolation insulating film and etching the second insulating material and the isolation insulating film to form an interlayer insulating film with the second insulating material, the interlayer insulating film wrapping around the tip structures except for upper parts of the tip structures; a seventh step of forming a resistance change layer on the upper parts of the tip structures of the each bit line, the interlayer insulating film and the isolation insulating film by depositing a resistance change material, and forming a plurality of contact holes that reach the each contact; and an eighth step of forming a plurality of word lines and word line contacts and a plurality of bit line contacts filled in the contact holes by depositing and etching a conductive material on the resistance change layer.

The protruding patterns of the third step may have a shape selected from a regular polygon, a circle, an ellipse and a rectangle being formed with one or more in a longitudinal direction of the each semiconductor line.

The protruding patterns of the third step may have a shape selected from a regular polygon, a circle and an ellipse being formed with a plurality at a predetermined interval and the each word line of the eighth step may be intersected with the each bit line at a location of a single tip structure.

The protruding patterns of the third step may have a rectangular shape being formed with a single and the each word line of the eighth step may be intersected with the each bit line at a location of a wedge shaped tip structure.

The second insulating material may be the same as the same as the first insulating material and the etching process of the second insulating material and the isolation insulating film is performed after a planarization process.

The forming of the tip structures of the fourth step may be is by anisotropically etching the semiconductor lines and/or the protruding patterns.

The tip structures may have an upper end size of 10 nm or less in a vertical direction to the each semiconductor line.

The protruding patterns of the third step may be formed of a semiconductor material.

The protruding patterns of the third step may be etching masks.

The etching masks may be formed by one process selected from photolithography, sidewall patterning and e-beam processes.

By forming a bottom electrode having an upwardly protruding tapered tip structure through etching a semiconductor substrate, the present invention enables an electric field to be focused on the tip of the bottom electrode across a top electrode and maximally minimize or localize a region where conductive filaments are formed. Thus, it is possible to significantly improve the resistance value (operating voltage) distribution problems in a high resistance state (HRS) and a low resistance state (LRS). It is also possible to reduce the voltage required for the operation and to improve the switching speed and the integration density of the whole array. In addition, it is also possible to design a highly compatible process with the conventional silicon process for ensuring effectively the ease of process, the economic respects of process and the high yield of process.

BRIEF DESCRIPTION OF THE DRAWINGS

FIGS. 15 to 17 are process perspective views showing a fabricating process of a memory array according to other embodiment of the present invention. Instead of FIG. 7, FIG. 15 is embodied. When it is carried out with FIG. 15, FIGS. 16 and 17 are process perspective views showing a memory array embodied instead of FIGS. 8 and 13, respectively.

FIGS. 18(a) and 18(b) show an implementable structure by a fabricating process of a memory array according to an embodiment of the present invention. FIGS. 18(a) and 18(b) are showing a nano-cone shaped tip structure and its enlarged view, respectively.

FIGS. 19(a) and 19(b) are showing a nano-wedge shaped tip structure and its enlarged view, respectively.

In these drawings, the following reference numbers are used throughout: reference number 10 indicates a semiconductor substrate, 20 a semiconductor line, 22 a bottom electrode or a bit line, 30 an isolation insulating film, 40 a protruding pattern, 50 a tip structure, 52 an upper part of the exposed tip structure, 60 a wedge shaped tip structure, 70 an interlayer insulating film, 80 a resistance change layer, 82 and 84 a protruding part of a resistance change layer, 90 a contact hole and 100 and 110 a top electrode or a word line.

DETAILED DESCRIPTION

Detailed descriptions of preferred embodiments of the present invention are provided below with reference to accompanying drawings.

First, a detailed description of a resistive random memory device according to an embodiment of the present invention is provided with reference to FIGS. 3 to 17.

Figure 1:
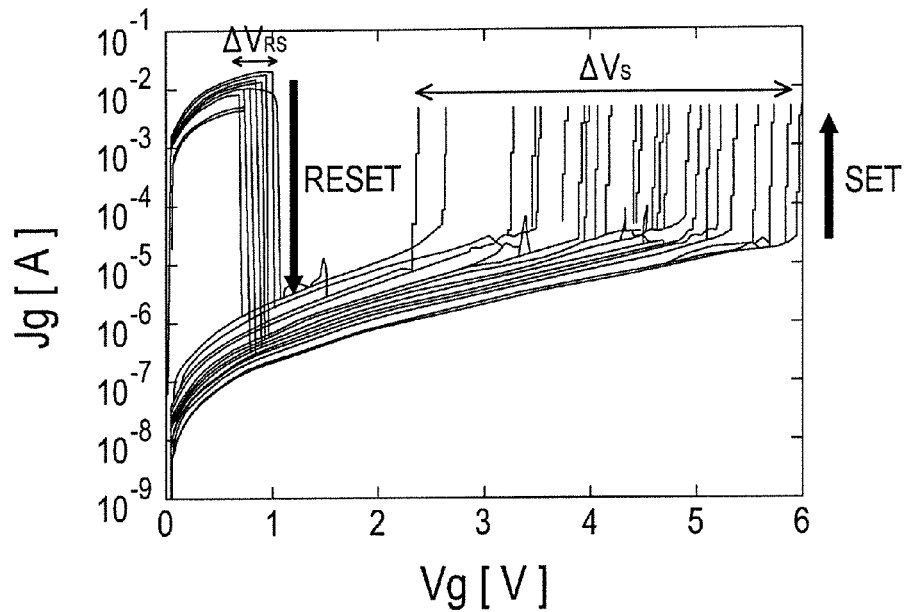
FIG. 1 is an electrical characteristic diagram showing the relationship of voltage Vg and current Jg between a bottom electrode and a top electrode in the conventional resistive random access memory device structure.
Figure 2:
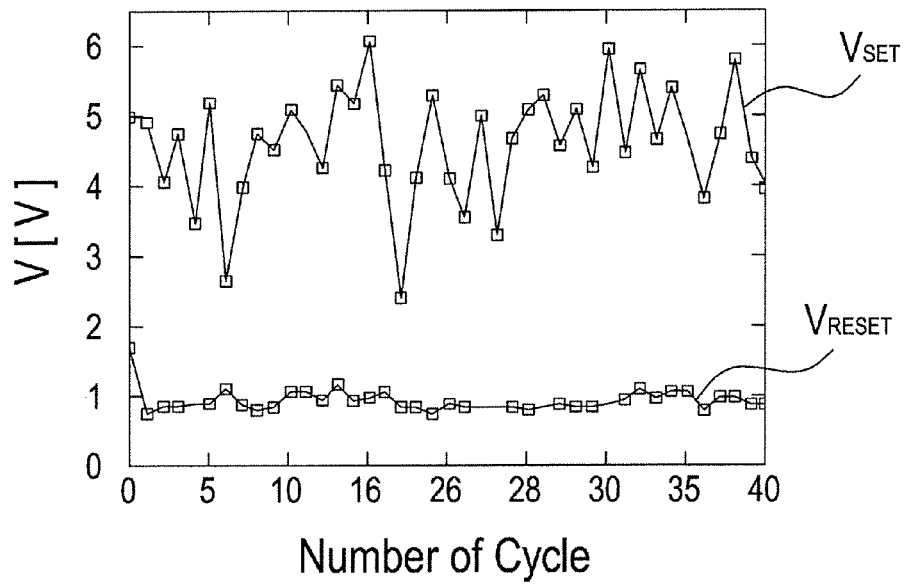
FIG. 2 is a $v_{SET}$ and $v_{RESET}$ distribution diagram showing $v_{SET}$ and $v_{RESET}$ caught and drawn each time when a current is rapidly changed in the conventional resistive random access memory device structure.
Figure 3:
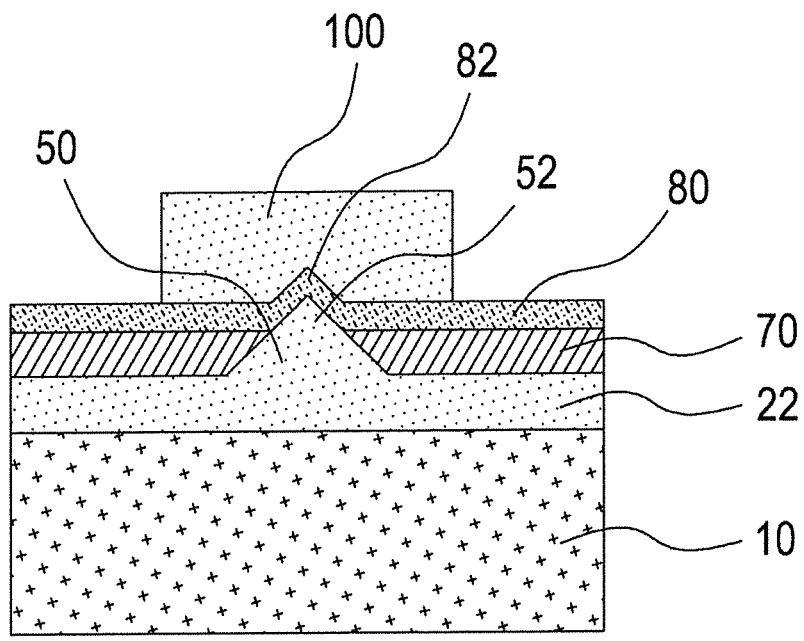
FIG. 3 is a cross sectional view illustrating the structure of a resistive random access memory device according to an embodiment of the present invention.

A resistive random access memory device according to an embodiment of the present invention, as exemplarily shown in FIG. 3, comprises: a bottom electrode 22 formed in a first direction by etching a semiconductor substrate 10, the bottom electrode 22 having an upwardly protruding tapered tip structure 50; an interlayer insulating film 70 formed on the bottom electrode 22, the interlayer insulating film 70 wrapping around the tip structure 50 except for an upper part 52 of the tip structure; a resistance change layer 80 formed on the upper part 52 of the tip structure 50 and the interlayer insulating film 70; and a top electrode 100 formed on the resistance change layer 80 in a second direction across the bottom electrode 22 over the tip structure 50.

Here, the semiconductor substrate 10 may be silicon or other semiconductor such as germanium, etc. And, referring to FIGS. 4 to 10, the bottom electrode 22, as described later, may be formed of a conductive line having an opposite conductivity type to the semiconductor substrate 10 by an ion implantation process on a semiconductor line 20 formed from the semiconductor substrate 10 by etching it. Thus, if the semiconductor substrate 10 is a P-type substrate, the bottom electrode 22 can be formed of an N-type conductive line. Of cause, the opposite can be also formed.

The bottom electrode 22, as shown in FIG. 3, has an upwardly protruding tapered tip structure 50.

The tip structure 50 may have a polygonal cone shape, a conical cone shape or a wedge shape. In case that the tip structure 50 has the wedge shape, it may be configured to have a predetermined length in the first direction and a triangular cross-section in the second direction.

Figure 8:
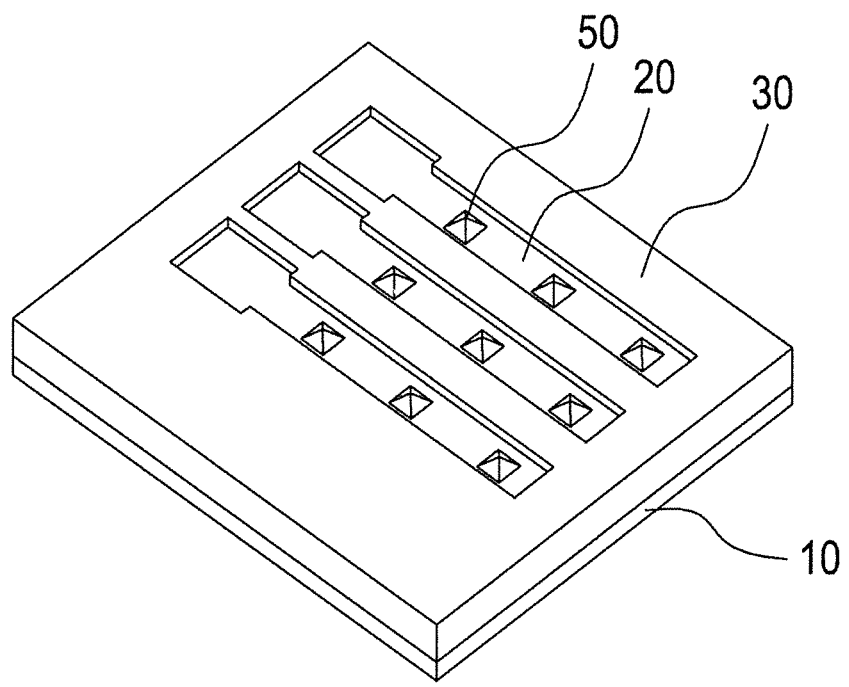

Although FIG. 8 shows, as an example, that a tip structure 50 of each resistive random access memory device is formed as a pyramidal shaped tetragonal-cone, the tip structure 50 is not limited to the tetragonal-cone and it is possible to be formed as a polygonal-cone. Further, it is possible to have a conical-cone shape as shown in FIG. 18 or a wedge shape having a predetermined length and a triangular cross-section as shown in FIGS. 15 to 17, 19(a) and 19(b).

Because the tip structure 50 is formed to be tapered upwardly and to have a sharp upper end, the upper end size (i.e., minimum width) in the second direction (i.e., the direction of the top electrode 100) can be less than a few nanometer, as an example, 10 nm or less.

Thus, it is possible to maximally minimize or localize a region where conductive filaments are formed in a resistance change layer 80 by concentrating an electric field to the upper end of the tip structure 50 of a bottom electrode 22 across a top electrode 100.

Because the interlayer insulating film 70 enables the exposed range of the upper part 52 of the tip structure 50 to be determined by adjusting the stacking thickness of the insulating film, it is possible to secondarily and more effectively restrict a region where conductive filaments are formed. The interlayer insulating film 70 may be a known insulating film such as a silicon oxide film when the semiconductor substrate is a silicon substrate, but as described later, it is preferable that the interlayer insulating film 70 is formed of an isolation insulating film used to isolate semiconductor lines.

And the resistance change layer 80 may be also formed of a known resistance change material by depositing to the thickness more than the height of the tip structure 50 exposed on the interlayer insulating film 70 and planarizing the upper part by the planarization process, etc. and then the top electrode 100 may be formed (not shown). But it is preferable that the resistance change layer 80 is formed to be upwardly protruded on the tip structure 50 as shown in FIG. 3 and the top electrode 100 is formed to wrap the protruding part 82 of the resistance change layer 80.

Next, a detailed description of a memory array according to an embodiment of the present invention is provided.

A memory array according to an embodiment of the present invention is using the above mentioned resistive random access memory device of the present invention as a unit cell device and, as shown in FIGS. 13 and 14(a), 14(b) or 17, and comprises: a semiconductor substrate 10; a plurality of bit lines 22 formed in a first direction on the semiconductor substrate 10; and a plurality of word lines 100 formed in a second direction across the bit lines 22, a resistance change layer 80 being located between the word lines 100 and the bit lines 22, wherein the bit lines 22 are formed in one body with the semiconductor substrate 10, each of the bit lines 22 being a bottom electrode line doped with an impurity and electrically insulated from adjacent lines with an isolation insulating film 30, the bottom electrode line having upwardly protruding tapered tip structures 50 along the first direction, wherein an interlayer insulating film 70 is further formed between the bit lines 22 and the resistance change layer 80, the interlayer insulating film 70 wrapping around the tip structures 50 except for upper parts 52 of the tip structures 50, wherein the resistance change layer 80 is formed on the upper parts 52 of the tip structures 50 of the each bit line 22, the interlayer insulating film 70 and the isolation insulating film 30, and wherein each of the word lines 100 is formed of a top electrode line passing over the tip structures 50 of the bit lines 22 along the second direction.

Here, as mentioned above, the tip structure 50 may have a polygonal cone shape, a conical cone shape or a wedge shape. In case that the tip structure 50 has the wedge shape, it may be configured to have a predetermined length in the first direction and a triangular cross-section in the second direction.

Although FIG. 8 shows, as an example, that a plurality of tetragonal-cone tip structures 50 are formed along each semiconductor line 20 at a predetermined interval, the tip structure 50 is not limited to the tetragonal-cone and it is possible to be formed as a polygonal-cone. Further, it is possible to have a conical-cone shape as shown in FIG. 18 or a single wedge shape 60 having a predetermined length and a triangular cross-section as shown in FIGS. 15 to 17 and 19.

Because the tip structure 50 is formed to be tapered upwardly and to have a sharp upper end, the upper end size (i.e., minimum width) in the second direction (i.e., the direction of the word line 100) can be less than a few nanometer, as an example, 10 nm or less.

Thus, it is possible to maximally minimize or localize a region where conductive filaments are formed in a resistance change layer 80 by concentrating an electric field to the end of the tip structure 50 of each bit line 22 across each word line 100.

Because the interlayer insulating film 70 and the resistance change layer 80 according to this embodiment are the same as those in the embodiment of a resistive random access memory device, each detailed explanation is omitted.

Figure 13:
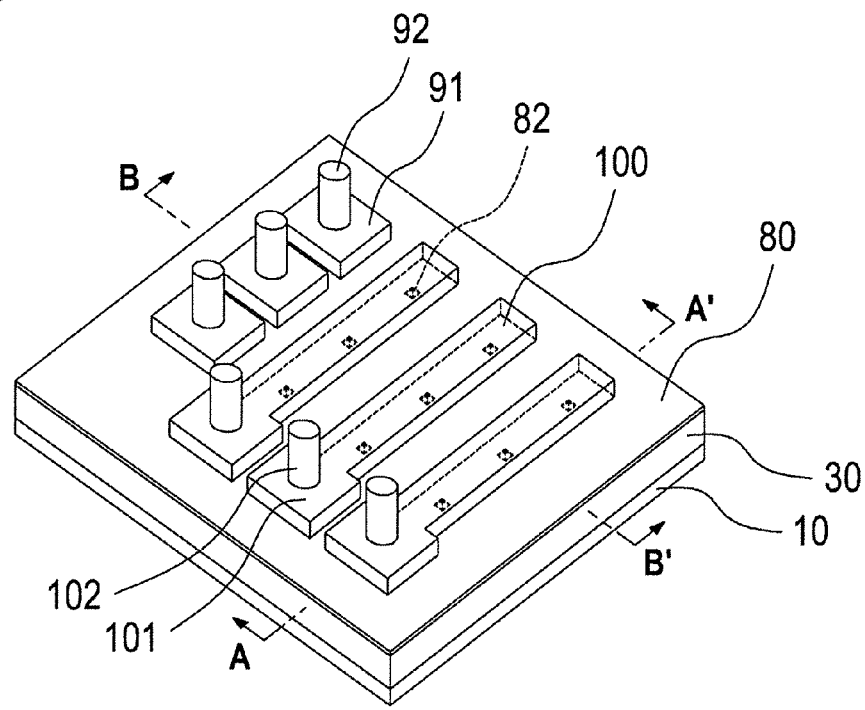
Figure 14A:
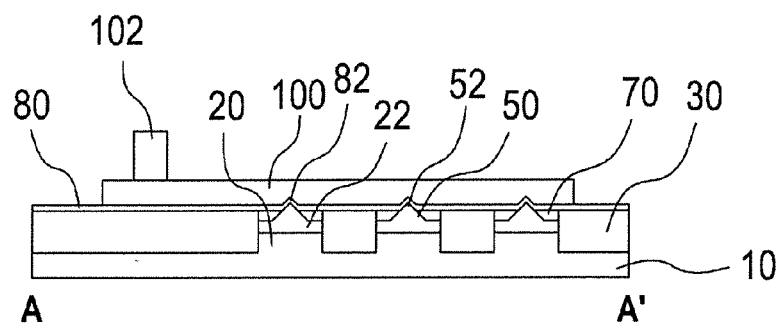
FIG. 14(a) is cross sectional view taken along line AA in FIG. 13
Figure 14B:
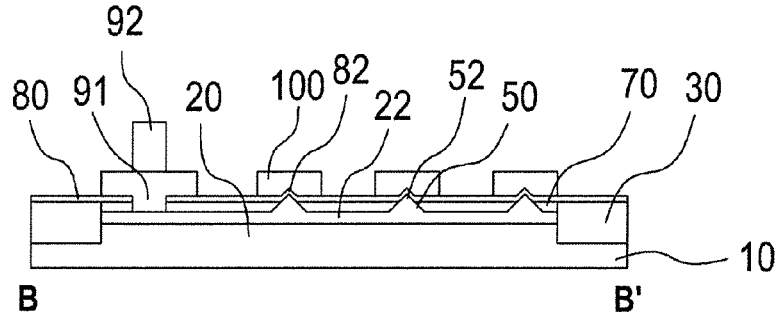
FIG. 14(b) is a cross sectional view taken along line BB in FIG. 13.

In FIGS. 13 and 17, the reference numbers 92, 102 and 110 indicate a bit line contact plug, a word line contact plug and a word line having a small width, respectively.

Next, a detailed description of a fabrication method of a memory array according to an embodiment of the present invention is provided with reference to FIGS. 4 to 14.

A fabrication method of a memory array according to an embodiment of the present invention is to fabricate the above mentioned memory array of the present invention.

Figure 4:
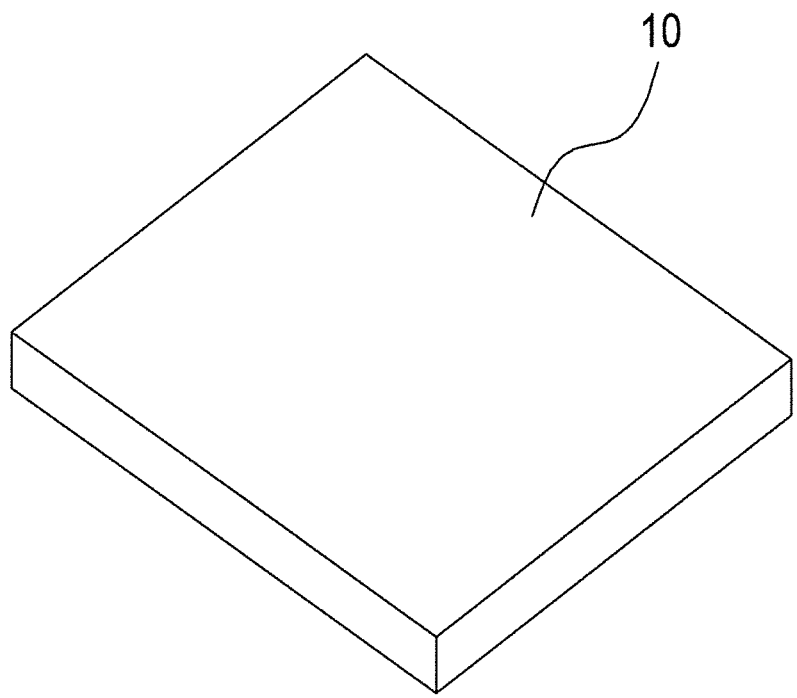
FIGS. 4 to 13 are process perspective views and cross sectional views taken along line AA' showing a fabricating process of a memory array according to an embodiment of the present invention.
Figure 5:
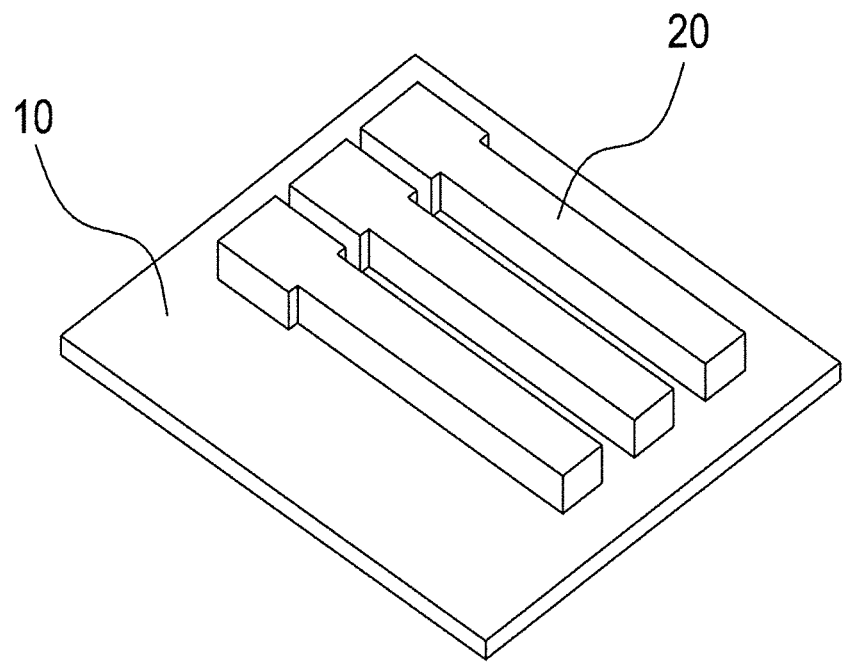

First, after a semiconductor substrate 10 for fabricating a memory array is prepared, as shown in FIG. 4, a plurality of semiconductor lines 20 for forming a plurality of contacts and bit lines is protruded by etching the semiconductor substrate 10 (a first step). The semiconductor substrate 10 may be a silicon substrate, but it can be other semiconductor substrate such as a germanium substrate and the like.

Figure 6:
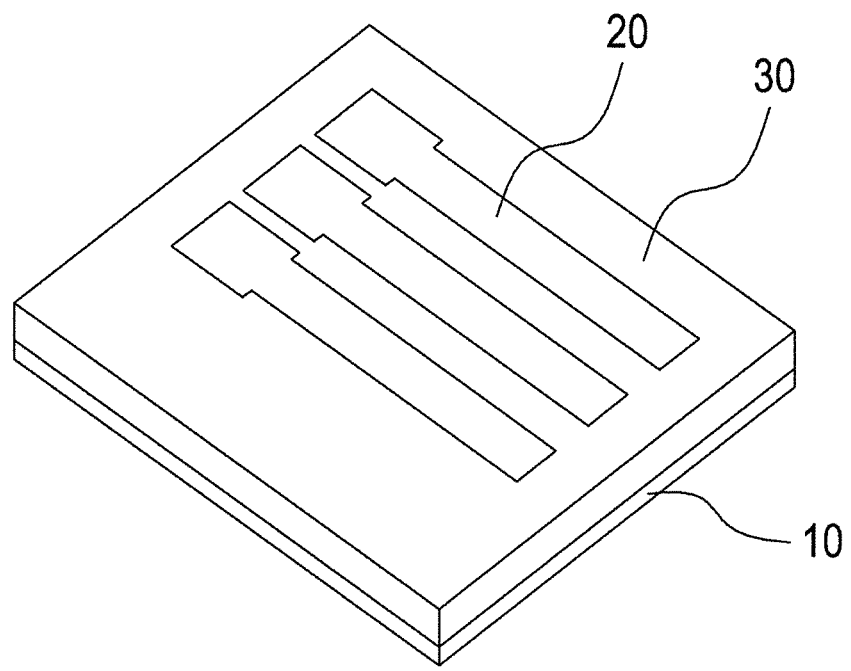

Then, as shown in FIG. 6, an isolation insulating film 30 is formed by depositing a first insulating material on the semiconductor substrate 10 and etching the first insulating material to expose upper parts of the semiconductor lines 20 and to be insulated from each other (a second step). The first insulating material may be an oxide film. After depositing the first insulating material, it is preferable that the first insulating material is planarized by the known CMP process, etc. and etched to be exposed the upper parts of the semiconductor lines 20.

Figure 7:
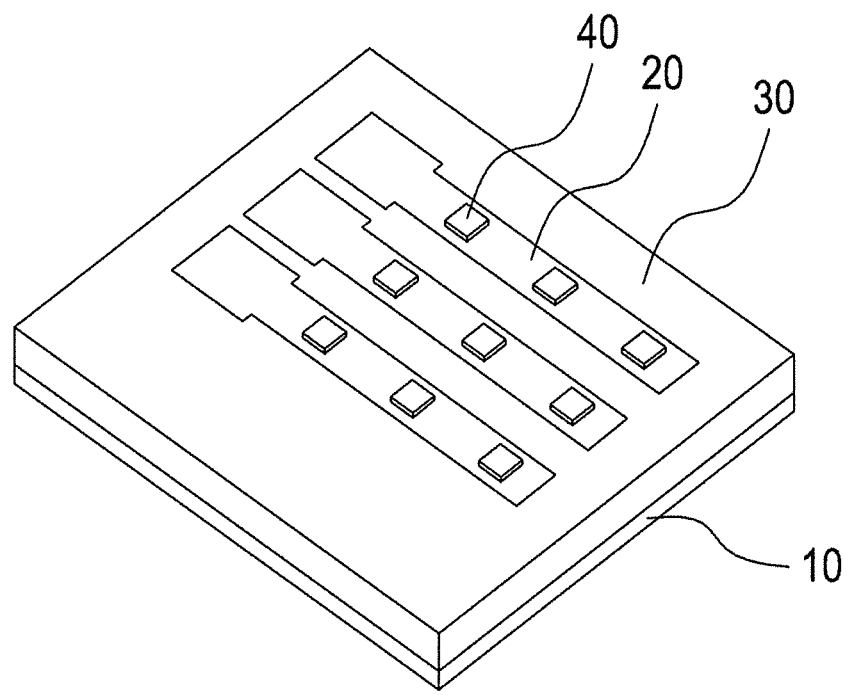

Next, as shown in FIG. 7, protruding patterns 40 are formed on the upper parts of the semiconductor lines 20 (a third step). The protruding patterns 40 can be formed by one of the following two processes. One process is to form tip structures by etching the protruding pattern itself 40. In this case, the protruding pattern 40 is formed of a semiconductor material such as the same or similar to the semiconductor substrate 10. The other is that the protruding patterns 40 are used as etching masks and the tip structures are formed by etching semiconductor lines exposed around the etching masks. In the latter case, although the etching masks may be used as dry masks, it is preferable to be used as wet masks formed of oxide or nitride. Specifically, for forming the etching masks, it is possible to use one process selected from photolithography, sidewall patterning and e-beam processes.

And the shape of the tip structures can be determined according to that of the protruding patterns 40. Thus, the protruding patterns 40 may have a shape selected from a regular polygon such as a square, etc., a circle, an ellipse and a rectangle and be formed with a single or a plurality at a predetermined interval in a longitudinal direction of each semiconductor line 20.

Figure 15:
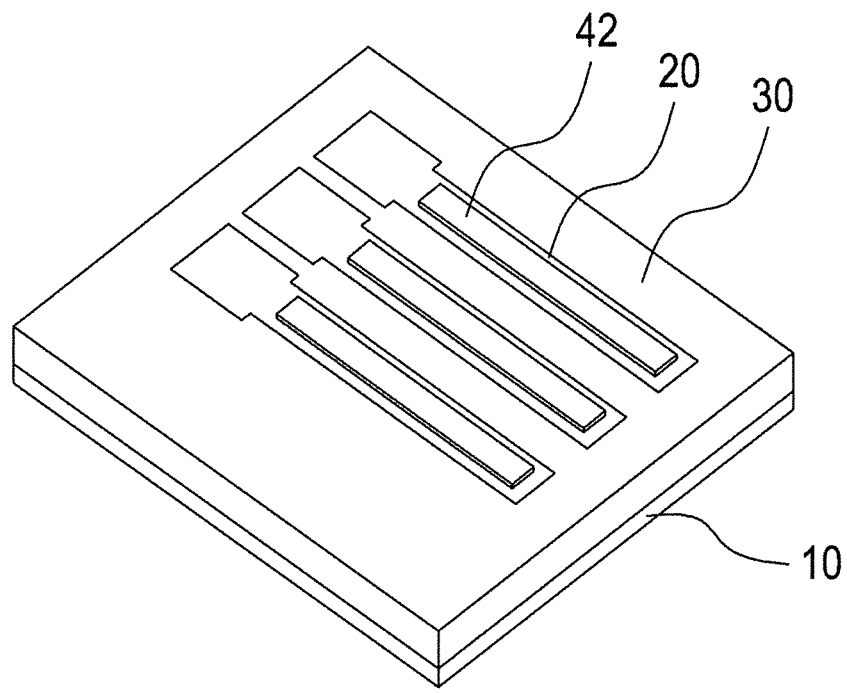

Although, in an embodiment shown in FIG. 7, the protruding patterns 40 are a square and are formed with a plurality in a longitudinal direction of each semiconductor line 20, in other embodiment shown in FIG. 15, the protruding patterns 40 can be a rectangle 42 and be formed with a single in each semiconductor line 20.

Next, as shown in FIG. 8, an upwardly protruding tapered tip structures 50 are formed on the upper part of a portion that forms each bit line by using the protruding patterns 40 (a fourth step). Namely, in case that the protruding patterns 40 are formed of a semiconductor material, the tip structures 50 are formed by etching the protruding patterns 40 and the exposed semiconductor lines 20. While when the protruding patterns 40 are formed to be used as etching masks, the tip structures 50 are formed by etching the semiconductor lines exposed around the etching masks.

Figure 16:
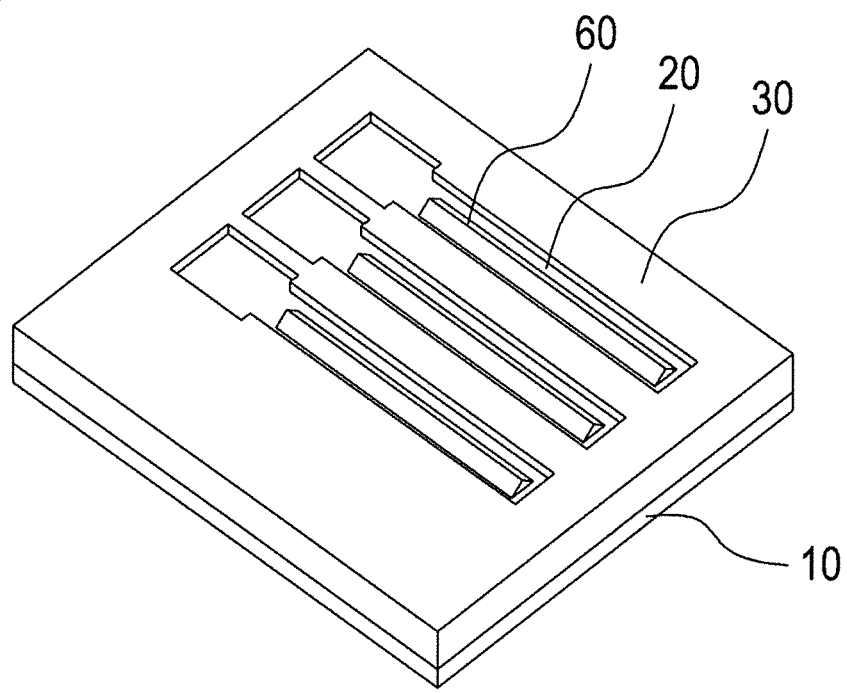
Figure 19A:
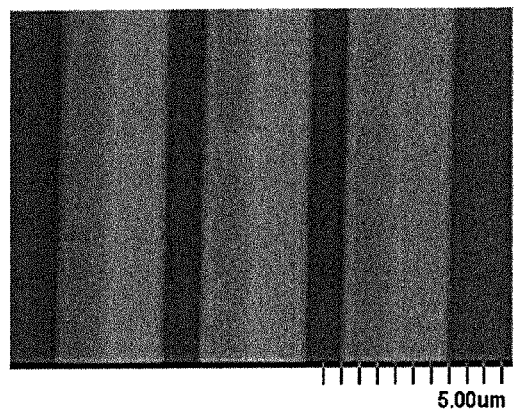
FIGS. 19(a) and 19(b) show an implementable structure by a fabricating process of a memory array according to other embodiment of the present invention.
Figure 19B:
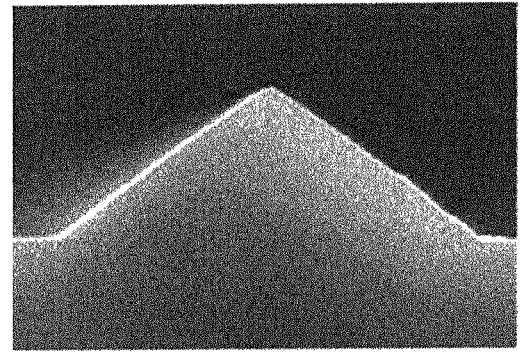

Although FIG. 8 shows, as an example, that a plurality of tetragonal-cone tip structures 50 are formed along each semiconductor line 20 at a predetermined interval, according to an embodiment shown in FIG. 15, the tip structures 50 can be formed with a single wedge shape having a predetermined length and a triangular cross-section on each semiconductor line 20 as shown in FIG. 16.

In the fourth step, when the etching of the semiconductor lines 20 and/or the protruding patterns 40 is performed to form the tip structures 50, it is preferable to use an anisotropic etching. Here, the anisotropic etching means to have different etching rates according to the crystal planes of a semiconductor. It is different from non-isotropic etching to etch vertically in a clear direction such as a dry etching and also different from an isotropic etching to etch uniformly in all areas contacted with etchant. Among the anisotropic etchings, an anisotropic wet etching is more preferred. When the semiconductor lines 20 and/or the protruding patterns 40 are formed of a silicon, referring to FIGS. 18 and 19, it is possible to embody a very sharp peak-type tip structure 50 having an upper end size (at a cross-section in the second direction, namely, minimum width) of a few nanometer nm, as an example, 10 nm or less by performing an anisotropic wet etching with etchant such as TMAH, KOH, etc.

Figure 9:
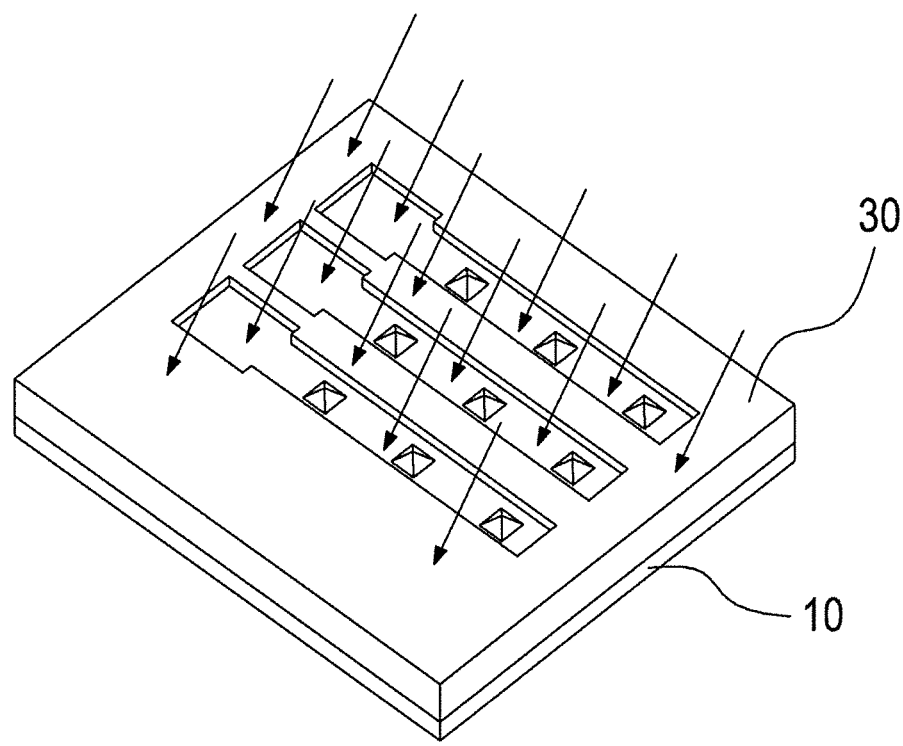

Next, as shown in FIG. 9, a plurality of contacts and bit lines are formed on the upper parts of the semiconductor lines 20 by performing an ion implantation process (a fifth step). Here, the ion implantation process is used to raise the electric conductivity of not only the protruding tip structures 50, but also the upper parts of the semiconductor lines 20 for forming the plurality of contacts and bit lines as conductive lines (namely, bottom electrodes). And to be insulated from the lower parts of semiconductor lines 20 and the semiconductor substrate 10, the plurality of contacts and bit lines may be formed of an N-type when the semiconductor substrate 10 is a P-type substrate. Of course, the opposite can be formed.

Figure 10A:
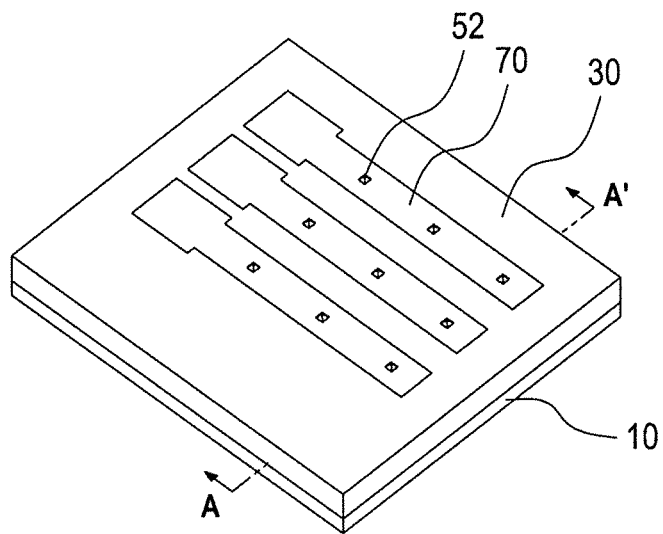
Figure 10B:
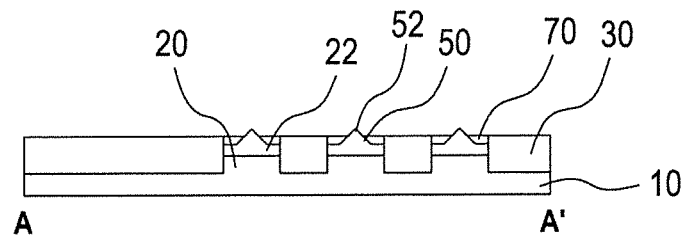

Then, as shown in FIGS. 10(a) and 10(b), a second insulating material is deposited on the upper parts of the plurality of contacts and bits lines 22 and the isolation insulating film 30, and the second insulating material and the isolation insulating film 30 are etched to form an interlayer insulating film 70 with the second insulating material, the interlayer insulating film 70 wrapping around the tip structures except for upper parts 52 of the tip structures 50 (a sixth step).

FIG. 10B is a cross sectional views taken along line AA' in FIG. 10(a). As shown in FIG. 10(b), because the exposed range of the upper part 52 of the tip structure 50 is determined by adjusting the thickness of the interlayer insulating film 70, it is possible to secondarily and more effectively restrict a region where conductive filaments are formed.

And it is preferred that the second insulating material is the same as the first insulating material forming the isolation insulating film 30. At this time, the etching process of the second insulating material and the isolation insulating film 30 can be carried out after depositing and further planarizing the second insulating material. By doing so, as shown in FIG. 10(b), because the interlayer insulting film 70 and the isolation insulating film 30 can be etched in a same horizontal plane, it is easy to protrude the upper parts 52 of the tip structures 50 of the each bit line 22.

Figure 11A:
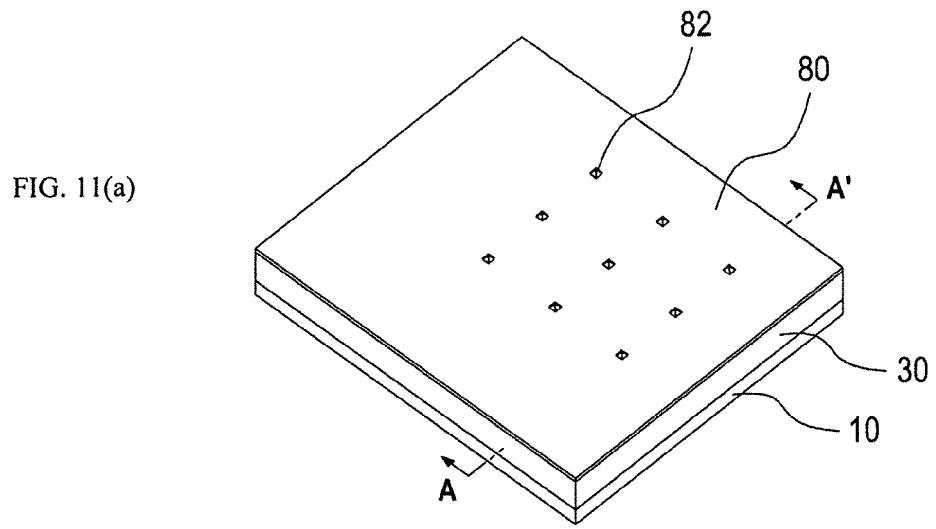
Figure 11B:
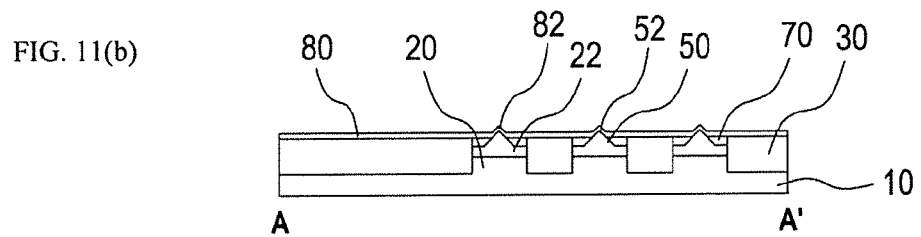
Figure 12A:
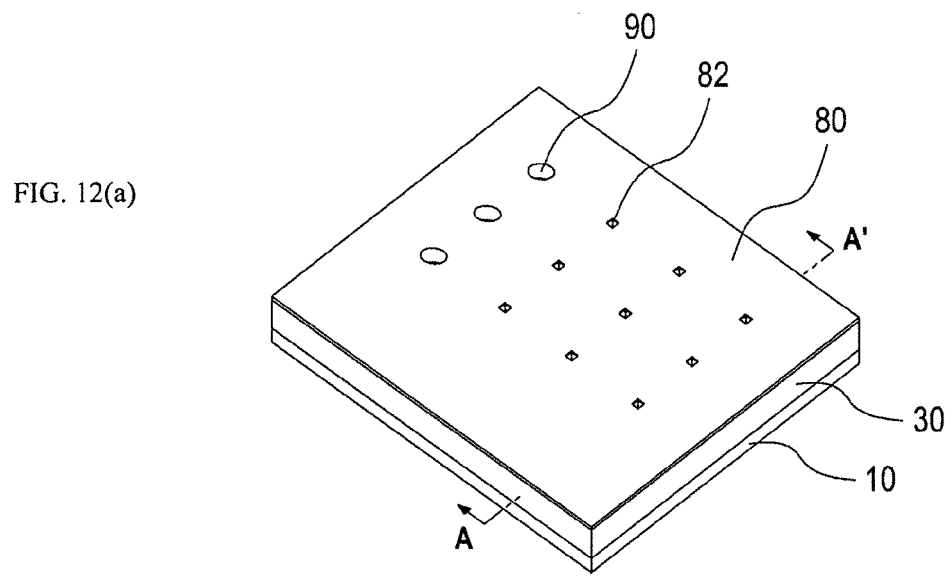
Figure 12B:
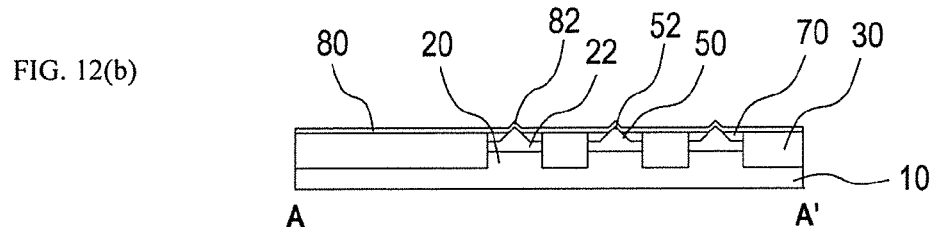

Next, as shown in FIG. 11, a resistance change layer 80 or 82 is formed on the exposed upper parts 52 of the tip structures 50 of the each bit line 22, the interlayer insulating film 70 and the isolation insulating film 30 by depositing a resistance change material and, as shown in FIG. 12, a plurality of contact holes 90 that reach the each contact are formed (a seventh step).

Here, the resistance change layer 80 or 82 may be formed of a known resistance change material. The resistance change material can be deposited with a thickness more than the height of the tip structures 50 exposed from the interlayer insulating film 70 and planarized by a planarization process, CMP etc. and then a following process for forming the top electrodes (word lines) 100 can be carried out (not shown). As other embodiment, the resistance change layer 80 or 82 can be upwardly protruded on the tip structure 50 as shown in FIG. 3 and be formed with a predetermined thickness, as shown in FIGS. 11(*b*) and 12(*b*), and the protruding parts 82 of the resistance change layer 80 can be formed on the tip structures 50 exposed from the interlayer insulating film 70. In a following process, as shown in FIG. 14, the top electrodes (word lines) 100 can be formed to wrap the protruding parts 82 of the resistance change layer 80.

Then, as shown in FIGS. 14(*a*) and 14(*b*), a plurality of word lines 100 and word line contacts 101 and a plurality of bit line contacts 91 filled in the plurality of contact holes 90 are formed by depositing and etching a conductive material on the resistance change layer 80 or 82 (an eighth step).

FIGS. 13, 14(*a*) and 14(*b*) show an example that the protruding patterns 40 of the third step can have a square shape and be formed with a plurality at a determined interval in a longitudinal direction of each semiconductor line 20 and the each word line 100 of the eighth step can be intersected with the each bit line 22 at a location of a singe pyramidal tip structure 50.

On the other hand, FIGS. 15 to 17 show another example that the protruding patterns 40 of the third step can have a rectangular shape 42 and be formed with a single in a longitudinal direction of each semiconductor line 20 and the each word line 110 of the eighth step can be intersected with the each bit line 22 at a location of a wedge shaped tip structure 60 as shown in FIGS. 16, 19(*a*) and 19(*b*).

This work was supported by the Center for Integrated Smart Sensors funded by the Korean Ministry of Science, ICT & Future Planning as Global Frontier Project (CISS-2012M3A6A6054186).

What is claimed is:

1. A resistive random access memory device comprising:
    a bottom electrode formed on a semiconductor line, the bottom electrode being formed by etching an upper portion of the semiconductor line to have an upwardly protruding tapered tip structure, the semiconductor line being etched from an upper portion of the semiconductor substrate such that the bottom electrode and the semiconductor substrate form one body with the unetched portion of the semiconductor substrate, the bottom electrode and the semiconductor line extending in a first direction and being oppositely doped to form a pn junction;
    an interlayer insulating film formed on the bottom electrode, the interlayer insulating film wrapping around the tip structure except for an upper part of the tip structure;
    a resistance change layer formed on the upper part of the tip structure and the interlayer insulating film; and
    a top electrode formed on the resistance change layer in a second direction across the bottom electrode over the tip structure.

2. The resistive random access memory device of claim 1, wherein the tip structure has a polygonal cone shape, a conical cone shape or a wedge shape, the wedge shape being configured to have a predetermined length in the first direction and a triangular cross-section in the second direction.

3. The resistive random access memory device of claim 2, wherein the resistance change layer is upwardly protruded along the upper part of the tip structure, and wherein the top electrode is formed to wrap the protruding part of the resistance change layer.

4. The resistive random access memory device of claim 1, wherein the tip structure has an upper end size of 10 nm or less in the second direction.

5. The resistive random access memory device of claim 2, wherein the tip structure has an upper end size of 10 nm or less in the second direction.

6. The resistive random access memory device of claim 3, wherein the tip structure has an upper end size of 10 nm or less in the second direction.

\* \* \* \* \*